US006344750B1

(12) United States Patent
Lo et al.

(10) Patent No.: US 6,344,750 B1
(45) Date of Patent: Feb. 5, 2002

(54) VOLTAGE CONTRAST METHOD FOR SEMICONDUCTOR INSPECTION USING LOW VOLTAGE PARTICLE BEAM

(75) Inventors: Chiwoei Wayne Lo, Campbell; Kenichi Kanai, Palo Alto, both of CA (US)

(73) Assignee: Schlumberger Technologies, Inc., Santa Clara, CA (US)

( * ) Notice: Subject to any disclaimer, the term of this patent is extended or adjusted under 35 U.S.C. 154(b) by 0 days.

(21) Appl. No.: 09/227,395

(22) Filed: Jan. 8, 1999

(51) Int. Cl.$^7$ ............................................... G01R 31/305
(52) U.S. Cl. ........................ 324/751; 324/752; 324/765; 250/310; 250/492.2
(58) Field of Search .............................. 324/765, 158.1, 324/71.3, 752, 753, 750, 751, 754, 501; 250/310, 307, 397, 492.2

(56) References Cited

U.S. PATENT DOCUMENTS

| | | | |
|---|---|---|---|
| 4,417,203 A | * 11/1983 | Pfeiffer et al. | 324/501 |
| 4,843,330 A | * 6/1989 | Golladay et al. | 324/751 |
| 5,401,972 A | 3/1995 | Talbot et al. | 250/491.1 |
| 5,493,116 A | 2/1996 | Toro-Lira et al. | 250/310 |
| 5,502,306 A | 3/1996 | Meisburger et al. | 250/310 |
| 5,578,821 A | 11/1996 | Meisberger et al. | 250/310 |
| 6,091,249 A | * 7/2000 | Talbot et al. | 324/751 |

FOREIGN PATENT DOCUMENTS

WO WO 98/32153 7/1998 ............ H01J/37/28

OTHER PUBLICATIONS

T.J. Aton, et al., "Testing integrated circuit microstructures using charging–induced voltage contrast," J. Vac. Sci. Technol. B 8(6), Nov./Dec. 1990, pp. 2041–2044.

Thomas R. Cass, "Use of the Contrast Effect for the Automatic Detection of Electrical Defects on In–Process Wafers," Technology Development Center. ICBD, Hewlett–Packard Co., Palo Alto, California pp. 506–1 thru 506–11. No month, year available.

Eiichi Goto, et al., "MOL (moving objective lens): Formation of deflective aberration free system," Optik, 48(1977) No. 3, pp. 255–270. No month available.

Keith A. Jenkins et al., "Analysis of Silicide Process Defects by Non–Contact Electron–Beam Charging," 30th Annual Proceedings, Reliability Physics 1992, San Diego, California, Mar. 31–Apr. 2, 1992. pp. 304–308.

E. Munro, "Design and optimization of magnetic lenses and deflection systems for electron beams," J. Vac. Sci, Technol., vol. 12, No. 6, Nov./Dec. 1975, pp. 1146–1150.

Hans C. Pfeiffer, "Recent Advances in Electron–Beam Lithography for the High–Volume Production of VLSI Devices," IEEE Transactions on Electron Devices, vol. ED–26, No. 4, Apr. 1979, pp. 663–674.

(List continued on next page.)

Primary Examiner—Ernest Karlsen
Assistant Examiner—Minh N. Tang
(74) Attorney, Agent, or Firm—Skjerven Morrill MacPherson LLP; Norman R. Klivans (57) ABSTRACT

Defects in a patterned substrate are detected by inspection with a charged particle beam inspection tool which generates an image of a portion of the patterned substrate and compares the image with a reference in order to identify any defects in the patterned substrate. Parameters of the tool are optimized to improve image uniformity and contrast, particularly voltage contrast. Prior to imaging an area of the substrate, the tool charges an area surrounding the image area to eliminate or reduce the effects caused by asymmetrical charging in the surrounding area. The tool alternates between charging the surrounding area and imaging the image area to produce a plurality of images of the image area, which are then averaged. The result is a highly uniform image with improved contrast for accurate defect detection.

18 Claims, 10 Drawing Sheets

OTHER PUBLICATIONS

H.C. Pfeiffer et al., "Advanced deflection concept for large area, high resoloution e–beam lithography," J. Vac. Sci., Technol., 19(4), Nov./Dec. 1981, pp. 1058–1063.

Norio Saitou, et al., "Variably shaped electron beam lithography system, EB55:II Electron optics," J. Vac. Sci. Technol., 19(4), Nov./Dec. 1981, pp. 1087–1093.

M. G. R. Thomson, "The electrostatic moving objective lens and optimized deflection systems for microcolumns," J. Vac. Sci. Technol. B 14(6), Nov./Dec. 1996, pp. 3802–3807.

John T. L. Thong, Ed., "Electron Beam Testing Technology," Plenum Press, New York and London, pp. 40–63. No Month, Year Available.

* cited by examiner

FIG. 10

VOLTAGE CONTRAST METHOD FOR SEMICONDUCTOR INSPECTION USING LOW VOLTAGE PARTICLE BEAM

RELATED PATENT APPLICATIONS

This application is related to U.S. patent application Ser. No. 08/892,734 filed Jul. 15, 1997, U.S. patent application Ser. No. 08/782,740 filed Jan. 13, 1997, U.S. Pat. No. 6,091,249 issued Jul. 18, 2000, U.S. patent application Ser. No. 09/226,962 filed on the same date as this application, U.S. patent application Ser. No. 09/227,747 filed on the same date as this application, and U.S. patent application Ser. No. 09/226,967 filed on the same date as this application, the contents of all of which are incorporated herein by reference.

BACKGROUND OF THE INVENTION

1. Field of the Invention

The present invention relates to the detection of defects in patterned substrates, such as semiconductor wafers, by inspection using a charged particle beam. More particularly, the present invention relates to improving the uniformity and voltage contrast of an image produced by a charged particle beam inspection tool.

2. Description of the Related Art

Defect detection is an important aspect in the manufacture of semiconductor devices. Early detection, preferably at multiple stages of fabrication, enables a source of defects to be identified and eliminated before large numbers of wafers are affected. Currently, the majority of in-line inspection is performed using optical inspection tools, such as the 21 XX-series wafer inspection tools from KLA-Tencor. These optical tools, however, are limited in their capabilities by their small depth of focus and blurring due to diffraction. The small depth of focus of these optical tools is an inherent limitation of the large numerical aperture objective lenses required to image sub-micron features. Any defect that is not at the surface of the device will be substantially out of focus and therefore undetectable. Examples of such sub-surface defects include polysilicon gate shorts, open vias and contacts, and metal stringers. In addition, the diffraction-limited resolution of optical tools blurs small surface defects rendering them undetectable as minimum critical dimensions (CDs) shrink below 0.25 µm. These include defects such as ~0.1 µm particles and regions of missing or extra pattern which are at or below the minimum CD.

Charged particle beam inspection will likely become one of the critical technologies in advanced semiconductor manufacture. Charge particle beam inspection tools, which include conventional scanning electron microscopes (SEMs), focused ion beam microscopes (FIBs) and electron-beam (E-beam) defect detection systems, have a much higher resolution than optical tools and are able to detect smaller size defects. E-beam defect detection systems can also detect sub-surface defects by measuring the voltage contrast change resulting from the electrical effect of killer defects, i.e., "open" and "short" type defects. See, for example: T. ATON et al., Testing integrated circuit microstructures using charging-induced voltage contrast, J. VAC. SCI. TECHNOL. B 8 (6), November/December 1990, pp. 2041–2044; K. JENKINS et al., Analysis of silicide process defects by non-contact electron-beam charging, 30TH ANNUAL PROCEEDING RELIABILITY PHYSICS 1992, IEEE, March/April 1992, pp. 304–308; J. THONG, ED., ELECTRON BEAM TESTING TECHNOLOGY, Pelnum Press 1993, p.41; and T. CASS, Use of the Voltage Contrast Effect for the Automatic Detection of Electrical Defects on In-Process Wafers, KLA Yield Management Seminar 1996, pp. 506-2 through 506-11.

Schlumberger's E-beam defect detection technology operates in either a positive or negative voltage contrast mode. In either mode, floating electrical conductors on the wafer under inspection are raised to a potential by pre-charging the surface of the wafer with charged particles (e.g. electrons). Because they appear in different contrasts, the floating and grounded connectors can therefore be distinguished. In a positive voltage contrast mode the floating conductors are charged to a more positive voltage than the grounded conductors, while in a negative voltage contrast mode the floating conductors are charged to a more negative voltage. A focused, low voltage particle (electron) beam interrogates the charge states of the wafer's conductors. By comparing the voltage contrast image (or partial image) of a die with that of a reference (e.g. a neighboring die), one can locate defects in the die. Because this technique relies on voltage contrast variation to identify defects, it is important to have: (1) a uniform voltage contrast image in which the background contrast is uniform; (2) a consistent contrast for a circuit when that circuit is located in different areas of the field of view; and (3) a distinctive contrast (e.g., a large difference) between circuit elements with different underlying connections.

One problem with charged particle beam inspection systems is that the resulting images are often non-uniform in quality. Unwanted variations in the topographic contrast or voltage contrast of an image often exist. Non-uniformity in the voltage contrast can result from uneven charging of a patterned substrate (wafer or die). Surface charging can affect secondary electron collection efficiency and the on-going charging process during primary beam irradiation. E-beam defect detection systems operate between two cross-over voltages, at which a primary electron induces more secondary electron emission current than primary current. This means that floating conductors within a field of view (FOV) will charge positively. Uncaptured secondary electrons which are returned to the wafer can negatively charge the area surrounding the FOV, thereby creating a "micro" retarding field (MRF). The MRF affects the surface charging process and can cause several problems with the voltage contrast of an image. First, the MRF can cause some secondary electrons to be rejected back into the FOV area of the wafer, thereby reducing the positive voltage contrast. Second, if the magnification of the system is increased for detailed inspection, the MRF can cause a positive voltage contrast mode to switch to negative. At a high magnification, a strong MRF will retard back enough secondary electrons back to the FOV area, thereby negatively charging the FOV area. Third, the MRF can create unpredictable "ghost features" and site dependent contrast variations in an image. The MRF is non-isotropic at the edge of the FOV, and the intensity of returned secondary electrons at the edge of the FOV can differ significantly from those at the center of the FOV. This results in uneven charging of floating structures. In addition, the efficiency of detecting secondary electrons emitted from the center and the edge of the FOV can differ greatly. These problems produce false contrast differences which greatly degrade the reliability of E-beam defect detection systems.

Since 1995, Schlumberger has used E-beam probers such as the commercially available IDS 10000 system on passivated integrated circuits (ICs) to measure waveforms at a high beam current. The E-beam prober scans a large area and then images a smaller area. A high current vectored beam is pulsed to measure capacitive AC waveforms on the passivated IC. Imaging the small area prior to scanning the large area reduces the unstable surface charging in the small area, thereby producing a more stable and accurate voltage waveform (as a function of time). The uniformity or contrast of an image is not a concern because the measurement is taken at the area of a conductor on an individual die. This method is only applicable to functioning integrated circuits connected to an electrical stimulus, rather than to unfinished patterned substrates.

It is also known to try to improve measurements produced by charged particle beam tools. International Application No. PCT/US98/00782 published on Jul. 23, 1998 as International Publication No. WO 98.32153 is directed to measuring critical dimensions of microcircuits using SEMs. Multiple scans of a SEM over a small scan area result in dark images, obscuring the features of the area. Scanning a larger area brightens the image. This method, however, merely brightens an image rather than enhances the image contrast differences between features with different underlying connections. In addition, simply brightening an area will not improve the uniformity of an image.

Accordingly, there is a need to improve the uniformity and contrast quality of an image produced by a charged particle beam inspection tool, in order to enhance the detection of defects on a patterned substrate. In particular, it would be desirable to enhance the voltage contrast of the image.

SUMMARY

In accordance with one embodiment of the present invention, a method for detecting defects in a patterned substrate includes directing a charged particle beam onto the substrate, scanning the beam across the substrate, and optimizing parameters of the beam to improve the uniformity and contrast of a resulting image. The defect detection is undertaken when the device is not completely fabricated. The method further includes acquiring at least a partial image of a first area of the substrate. This step includes charging a second area of the substrate and imaging the first area. The second area encompasses the first area. The acquired image is then compared with a reference (e.g., by human inspection of the image or automatically with a processor) in order to identify any defects in the patterned substrate.

The voltage contrast quality of the image may be optimized by adjusting any one or more of a scan area size, scan speed, beam dose, beam current, beam energy, beam spot size (e.g., by de-focusing the lens), wafer chuck bias voltage, charge control plate bias voltage, energy filter voltage, and scan direction relative to a circuit pattern. The settings for scanning the first and second areas need not be the same.

In accordance with a further embodiment, a method of optimizing voltage contrast quality uses the charge control apparatus as stated in U.S. patent applications Ser. No. 08/892,734 filed Jul. 15, 1997, and Ser. No. 08/782,740 filed Jan. 13, 1997, and U.S. Pat. No. 6,091,249 issued Jul. 18, 2000. An electric field perpendicular to the wafer surface can be generated by biasing two electrodes that sandwich the wafer in order to control surface charging during the image scan (small area scan) and pre-charge scan. The field strength used during the imaging and pre-charging scans can be different. The voltage contrast image can also be enhanced by adjusting the energy filter voltage during the small scan following conventional E-beam prober practices.

In accordance with another embodiment, a method for detecting defects in a patterned substrate includes directing a charged particle beam onto the substrate, scanning the beam across the substrate, and optimizing parameters of the beam to improve a resulting voltage contrast image. Optimizing the beam's parameters includes generating a performance matrix. The method further includes charging a first area of the substrate with a flood beam from a flood gun and interrogating a second area, encompassed by the first area, of the substrate, with a focused beam from a primary gun to acquire a voltage contrast image of the second area. The acquired voltage contrast image is then compared with a reference to identify any defects in the patterned substrate.

In accordance with a further embodiment, a method of optimizing a voltage contrast image and a speed of image acquisition includes determining upper and lower limits for parameters controlling a charged particle beam. The upper limits define an upper first area size and dose, at which the best voltage contrast image is produced, and the lower limits define a lower first area size and dose, at which the speed of image acquisition is optimized. The best voltage contrast image has a large contrast difference between circuits with different underlying connections. In addition, the voltage contrast is uniform with consistent contrast across the field of view for circuits of the same underlying connections. The method further includes creating a performance matrix indicating a voltage contrast quality and a time required to perform a charge operation at each first area size and dose, and then selecting from the performance matrix a particular first area size and dose based on the desired voltage contrast quality.

In accordance with still another embodiment of the present invention, an apparatus for detecting defects in a patterned substrate includes a charged particle beam column, a detector and at least one processor. A charged particle beam irradiates the patterned substrate to charge a first area of the substrate and to scan a second area, smaller than the first area, to acquire an image of the second area. The scanner operates at a high amplitude when the charged particle beam charges the first area and at a lower amplitude when the charged particle beam scans the second area. The charged particle beam charges the first area prior to scanning the second area to produce an image with uniform contrast. The detector detects secondary electron signals from the substrate. These signals are used to form the image of the second area, and the at least one processor compares the acquired image with a reference to identify defects in the patterned substrate.

In accordance with another embodiment, an apparatus for detecting defects in a patterned substrate includes a charged particle beam column, a mechanical stage, a detector, and at least one processor. The stage positions the patterned substrate relative to the column. The column includes a flood gun such as an in-the-lens flood gun, a primary gun, and a scanner such as a large field of view lens with main field and sub-field capabilities. The flood gun emits a flood beam for charging a first area of the substrate, and the primary gun emits a focused beam for scanning a second area., less than the first area, to acquire an image of the second area. The flood beam charges the first area before the focused beam scans the second area to produce an image with uniform voltage contrast. The beam scanner operates at a high amplitude when the flood beam charges the first area and at a lower amplitude when the focused beam scans the second area. Secondary electron signals detected by the detector are sent to a frame grabber to form an image of the second area. In case of a large field of view objective lens, multiple images can be acquired on different parts of the substrate before the stage need be moved. By pre-charging an area before moving to another area, one can avoid artifacts caused by imaging the previous area. More than one image can be acquired between each pre-charge step by repeating the above-mentioned steps. The at least one processor compares the acquired image with one or more references to identify defects in the patterned substrate.

The present invention, therefore, provides both a method and apparatus for detecting defects in an incomplete patterned substrate by inspecting the conductive or semiconductive regions, such as contacts or unfilled vias, of the substrate. In particular, the invention improves the uniformity and contrast of an image which facilitates the detection of defects. A good voltage contrast image has a uniform background contrast throughout the image, a consistent contrast for a circuit when located in different areas of the field of view, and a distinctive voltage contrast between devices of different underlying connections. The comparison of a good voltage contrast image with a reference (e.g., another die or a previously stored image) is less likely to result in false defects.

BRIEF DESCRIPTION OF THE DRAWINGS

The present invention may be better understood, and its numerous objects, features and advantages made apparent to those skilled in the art by referencing the accompanying drawings.

The use of the same reference symbols in different drawings indicates similar or identical elements.

DETAILED DESCRIPTION

Figure 1:
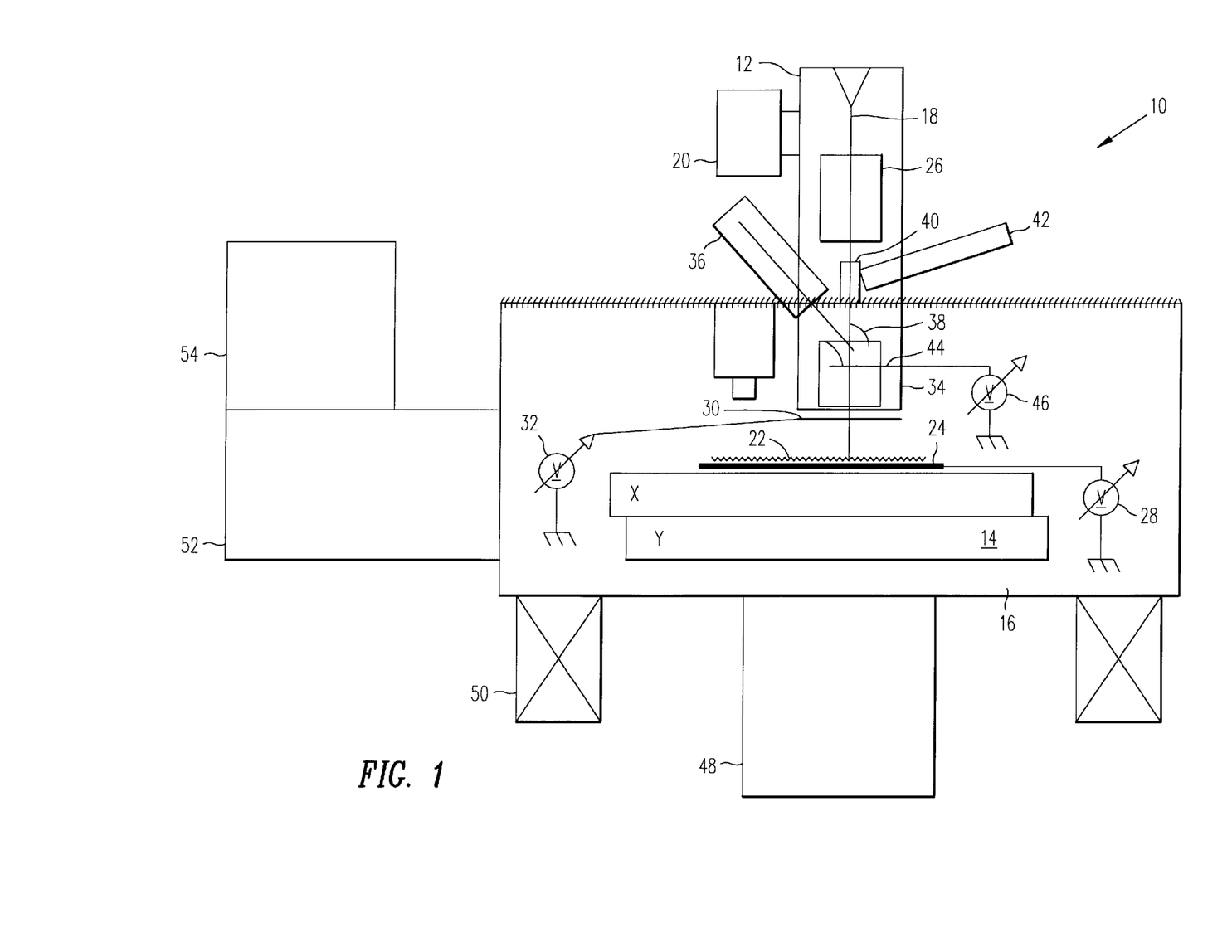
FIG. 1 is a schematic illustration of a charged particle beam inspection tool in accordance with the present invention.

FIG. 1 illustrates a charged particle beam inspection tool 10 in accordance with the present invention suitable for inspection of patterned (at least partly completed) semiconductor wafers. Tool 10 includes an electron-optical column 12, an X-Y stage 14 and a vacuum-chamber 16. Electron-optical column 12 has an electron beam source 18 such as a Thermal Field Emission (TFE) electron gun of the type used in most modern scanning electron microscopes (SEMs), for example with a zirconium-tungsten cathode. The electron gun is pumped directly by an ion pump 20. High vacuum in the electron gun is separated from the rest of column 12 and chamber 16 by a differential pumping aperture (not shown), as in most modem SEMs. The primary beam landing energy is adjustable, for example in the range from 500 eV to 1.5 keV. Beam current at a specimen or wafer 22 mounted on a wafer chuck 24 is adjustable, such as with an electron beam condenser lens 26 and a beam limiting aperture (not shown), for example in the range from ~500 pA to ~10 nA, or even up to 25–50 nA into a spot size of <0.1 $\mu$m. Electron-optical column 12 together with wafer chuck 24, having a bias source 28, and a charge control plate 30, having a bias source 32, are a Local Charge Control Module (LCCM).

Electron-optical column 12 includes a large field of view (FOV) electron beam objective lens 34, such as the known Variable Axis Immersion Lens (VAIL). Objective lens 34 can be a VAIL lens similar to that used in the commercially available Schlumberger ATE IDS 5000 and IDS 10000 E-beam probing systems. For example, the lens is a magnetic-immersion type where the specimen is held in a "magnetic bottle" and allows for collimation and efficient collection of secondary electrons without the need to apply a strong electrostatic collection field. A strong electrostatic collection field is undesirable, as it may cause unstable surface charging and can preclude independent optimization of the wafer bias, extraction potential and energy filter to enhance voltage contrast. Lens 34 can be equipped with both pre-deflection and deflection coils (not shown) to achieve a large FOV (such as 0.25 mm to 1.5 mm across) with high resolution (such as 30–100 nm). In one embodiment, a FOV of 0.25–1.5 mm across has been demonstrated with resolution of <50 nm.

Objective lens 34 is equipped with an "in-the-lens" electron flood gun 36 and a flood beam bending electrode 38 that allows fast multiplexing between a broad, high-current electron flood beam for pre-charging wafer 22 and its conductors and a low voltage, high resolution primary imaging beam for fast imaging to interrogate the charge states of the wafer's conductors. A low voltage primary imaging beam is preferred, because it will not damage wafer 22. In addition, controllable charging can be achieved with a low voltage beam. Fast imaging is performed, for example, at a pixel acquisition rate of 1 MHz to 100 MHz. A suitable flood gun is described in above-referenced co-pending U.S. patent application Ser. No. 08/782,740 filed Jan. 13, 1997 and U.S. Pat. No. 6,091,249 issued Jul. 18, 2000. Flood gun 36 in combination with wafer chuck 24 and charge control plate 30 and their respective bias sources 28 and 32 are a Global Charge Control Module (GCCM). In the alternative, the primary beam is used both to pre-charge the wafer's conductors and to image the wafer.

Secondary electrons are generated at the surface of wafer 22 by raster-scanning the primary beam over the surface. These secondary electrons are collected by the lens field, travel back through the bore of lens 26, and are separated from the primary electron beam by a conventional Wien filter 40, which has crossed magnetic and electric fields. The secondary electrons are then detected by an electron detector 42, such as a scintillator-PMT combination, also known as an Evahart-Thornley detector. Other detector combinations may also be used. Provision is advantageously made to shield electron detector 42 against damage or rapid aging from the strong secondary electron current generated when the flood beam is in use. Detector 42 supplies a signal which can be used to form an image of the scanned region of the specimen.

In FIG. 1, provision is made to apply independent bias voltages to charge control plate 30 from bias source 32 and to wafer chuck 24 from bias source 28. The bias voltage applied to wafer chuck 24 is effectively applied to the substrate of wafer 22. These bias voltages can be independently set, under computer control if desired, to optimize voltage contrast depending on the type of wafer being imaged and the type of defect to be detected. As described in more detail in above-referenced co-pending U.S. patent application Ser. No. 08/892,734 filed Jul. 15, 1997, the system can operate to produce either a positive or a negative wafer surface voltage. The wafer bias can also be used to vary independently the beam landing energy at the surface of wafer 22. This is desirable for instance, as some wafers with thin layers, such as silicide, require a low landing energy without compromising resolution to prevent charge leakage to other layers from beam punch-through.

The bore of lens 34 is equipped with a planar filter electrode 44, also called an energy filter mesh, having a bias voltage source 46. Electrode 44 serves as a retarding field electron energy spectrometer, as in the above-mentioned Schlumberger IDS 5000 and IDS 10000 systems. The energy filter can be used to optimize voltage contrast for certain wafer types by collecting secondary electrons with a specific retarding potential or energy range, for example in the range from zero to ~15 eV energy off the wafer.

X-Y stage 14 is, e.g., a conventional high-speed wafer stage equipped to handle, e.g., wafers up to 300 mm in diameter, allowing inspection of the entire upper surface of the wafer. Wafer 22 is supported on wafer chuck 24 such as a conventional electrostatic-type chuck. In general, stage 14 should be suitable for use in a vacuum environment. Stage 14 is designed to: (1) minimize unwanted beam deflection and lens interference; (2) meet clean-room compatibility standards; and (3) and achieve reasonable accuracy. Stage 14 is capable of high-speed operation as well as precise scanning and stepping operation to enable detection of the widest possible range of defects. For example, the stage may have a settling time of <0.3 s, a linear speed of 100 mm/s, and a laser-interferometer feedback for detecting positional accuracy within ~0.1 $\mu$m. Further details as to the operation and alignment of wafer 22 on stage 14 may be found in above-mentioned co-pending U.S. patent application Ser. No. 09/226,967 filed on the same date as this application.

Vacuum chamber 16 of tool 10 is vacuum pumped directly by a turbo pump 48 and an oil-free backing pump (not shown). Vacuum chamber 16 is mounted on an active vibration isolation platform 50 which cancels environmental vibration and also predictively cancels motion due to fast acceleration and deceleration of stage 14. A conventional wafer loadlock subsystem 52 is included to minimize wafer change over time and to allow the main vacuum chamber to stay at a high vacuum, such as 1E-6 Torr for long periods. Maintaining vacuum 16 also minimizes hydrocarbon contamination of the wafer. Wafer loadlock subsystem 52 conventionally includes wafer handling robots for automatic loading and unloading of wafers from a wafer cassette 54.

Figure 2:
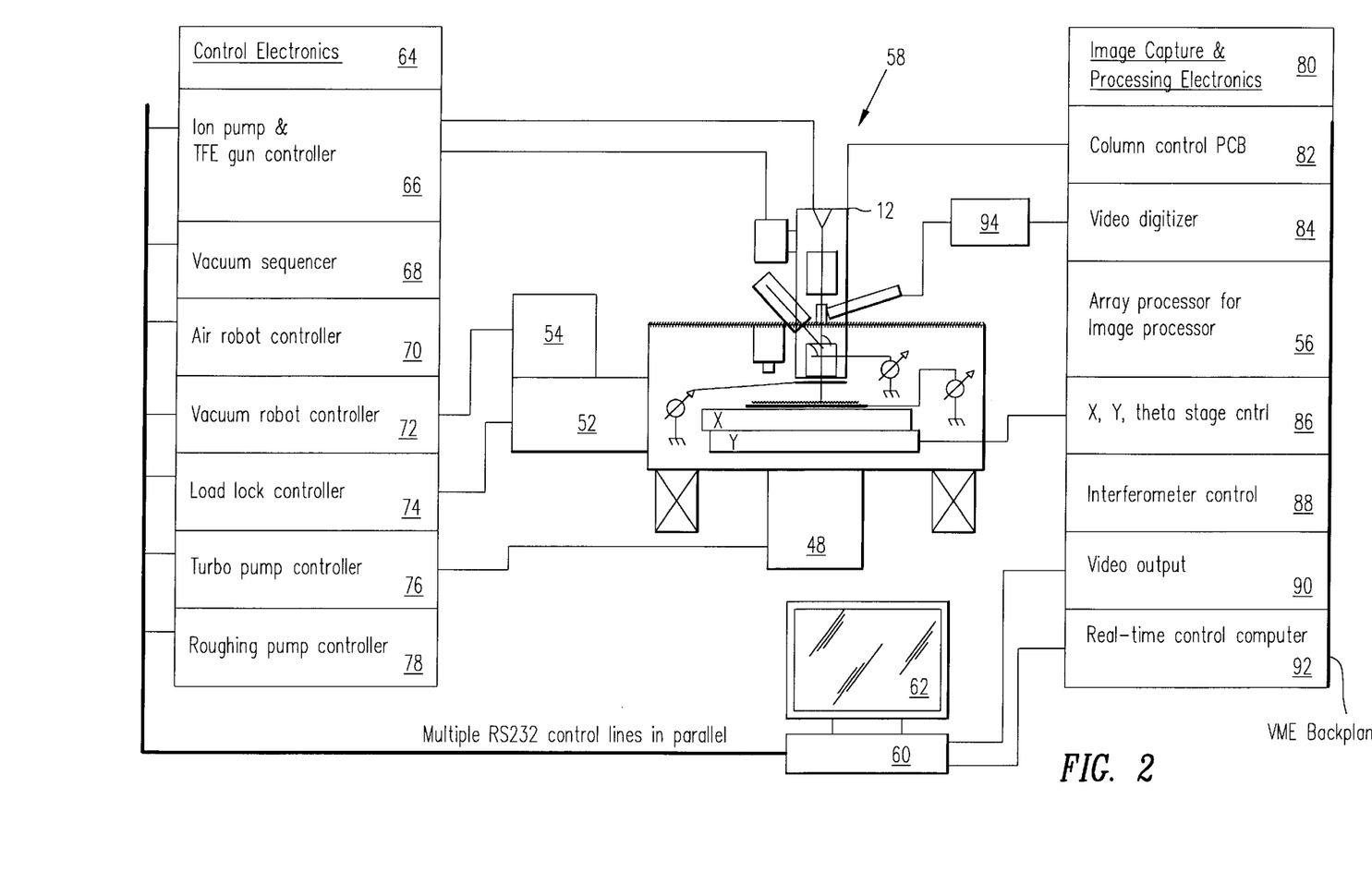
FIG. 2 is a schematic illustration of the charged particle beam inspection tool of FIG. 1.

FIG. 2 illustrates a block diagram of a charged particle beam inspection tool 10. An image processing subsystem 56 which is largely conventional carries out data processing for image alignment and image comparison. Image processing subsystem 56, such as a properly programmed multiprocessor-array computer from Mercury Computer Systems of Chelmsford, Mass., includes video input and output boards, an array of processors, random-access memory and a large disk store. For example, image processing subsystem 56 may comprise an array of thirty-two 300 MHz Power PC processors, 4 Gbytes of RAM and a 200 Gbytes disk store for storage of reference images and defect data. Image processing subsystem 56 can be programmed to execute a range of conventional image processing algorithms including but not limited to: cell-to-cell comparison for memories; die-to-die comparison or die-to-reference for random logic; and feature-based comparison for contacts and other layers. Feature-based comparison is described in more detail in co-pending U.S. patent application Ser. No. 09/227,747 filed on the same date as this application.

A defect detection system 58 includes a control computer 60, such as a personal computer having a display 62 and a Pentium processor running the Windows NT operating system and system control software (not shown). Defect detection system 58 also includes control electronics 64 under control of computer 60 for providing signals to operate the described system elements. Defect detection system 58 advantageously may include a multi-level, easy to use, graphical user interface (not shown) to support use by either operators in an automated factory environment based on predefined stored defect detection recipes or by engineers in a laboratory or process development environment. Conventional software can be provided for functions such as system control, image processing, automatic beam setup, beam alignment, auto-focus and auto-astigmatism correction.

Conventional control electronics 64 include, for example, an ion pump and TFE gun controller 66, a vacuum sequencer 68, an air robot controller 70, a vacuum robot controller 72, a load lock controller 74, a turbo pump controller 76 and a roughing pump controller 78.

Image processing subsystem 56 forms part of image capture processing electronics 80, which also includes an electron optical column controller 82, a video digitizer 84, a mechanical stage controller 86, an interferometer controller 88 for mechanical stage position and beam position feedback, a video output stage 90 for supplying an image signal to control computer 60 for display, and a real-time control computer 92 having a real-time operating system such as VxWorks or the like. The signal from electron detector 42 (FIG. 1) is supplied to a low noise video amplifier, which may have autofocus signal capability and which passes the electron detector signal to video digitizer 84.

Figure 3:
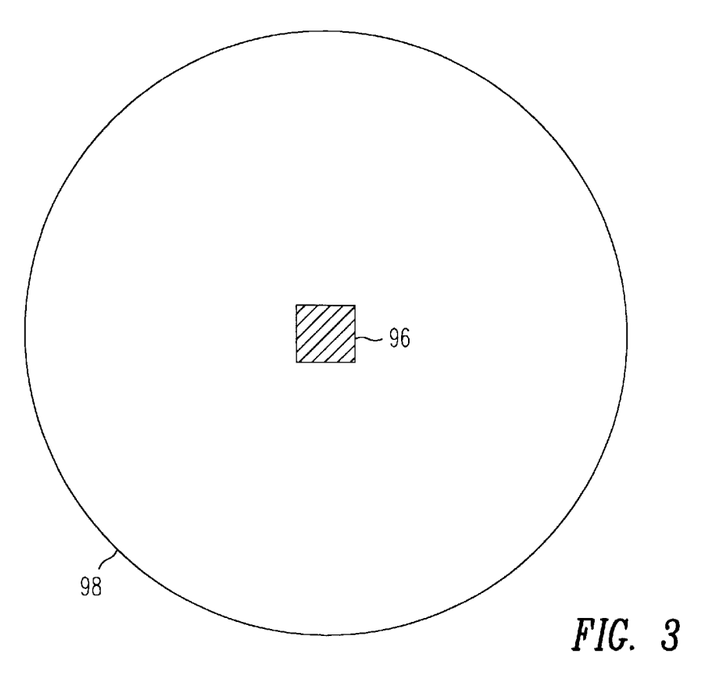
FIG. 3 is a top plan view of a portion of a wafer illustrating a negatively charged area outside of an imaging area created as a result of uncaptured secondary electrons.

As discussed earlier, during the operation of tool 10, secondary electrons are generated at the surface of wafer 22. Some of these secondary electrons are recaptured by lens 26 and detected by electron detector 42, which generates a signal used to form an image of the scanned region of the wafer. Other secondary electrons return back to the surface, depending on electrode and energy filter settings. Part of these returned secondary electrons fall outside of the imaging area of the primary beam of electron source 18. FIG. 3 illustrates in a plan view a portion of a wafer including an image area 96 and a negatively charged area 98 created by uncaptured secondary electrons outside of image area 96. These secondary electrons which negatively charge the area surrounding image area 96 result in the development of a "micro" retarding field (MRF) directly on the imaging area, as will be discussed in more detail below.

Figure 4A:
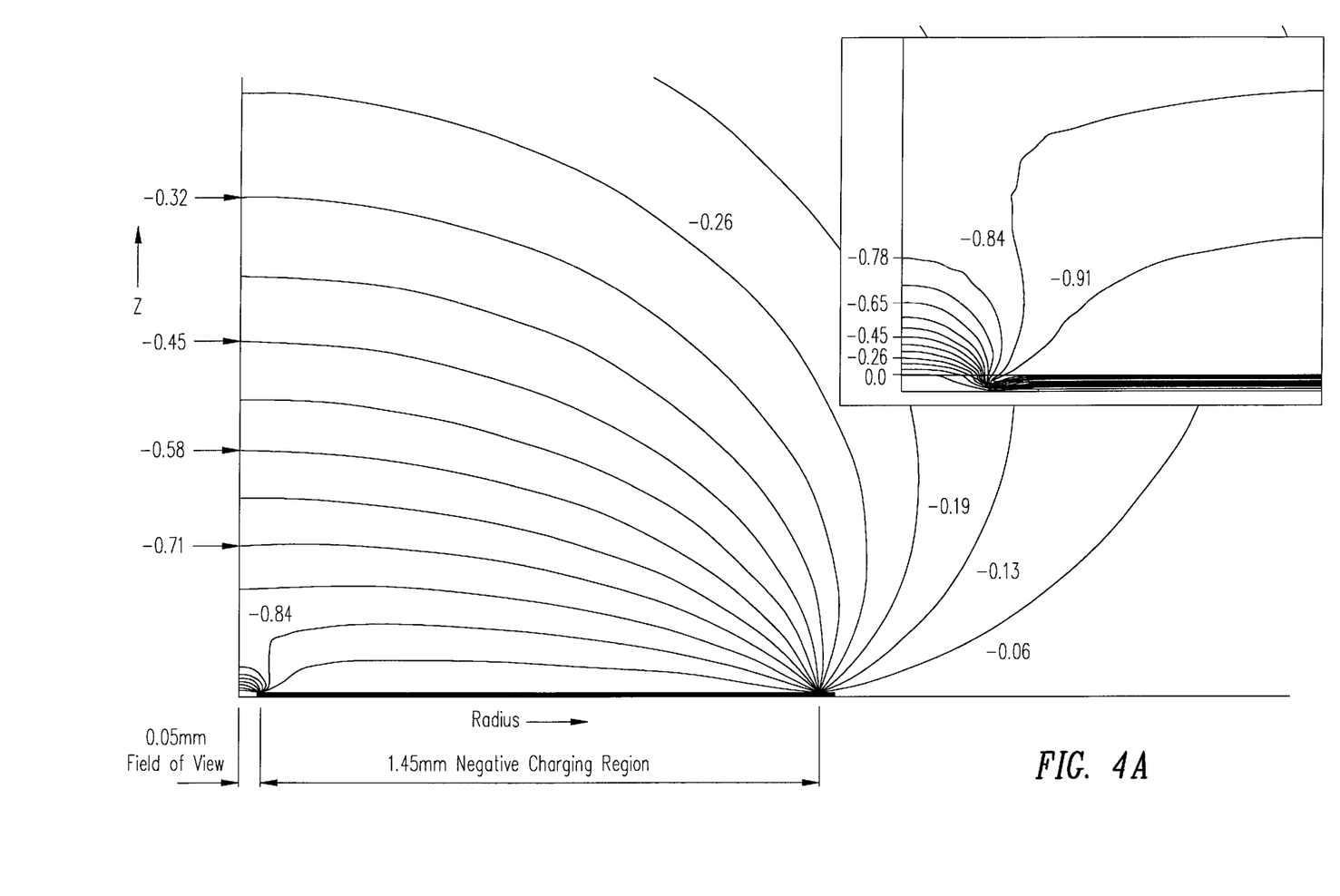
FIGS. 4A and 4B are computer simulations of a wafer illustrating the effect of negative charges surrounding 0.05 mm and 0.5 mm fields of view, respectively.
Figure 4B:
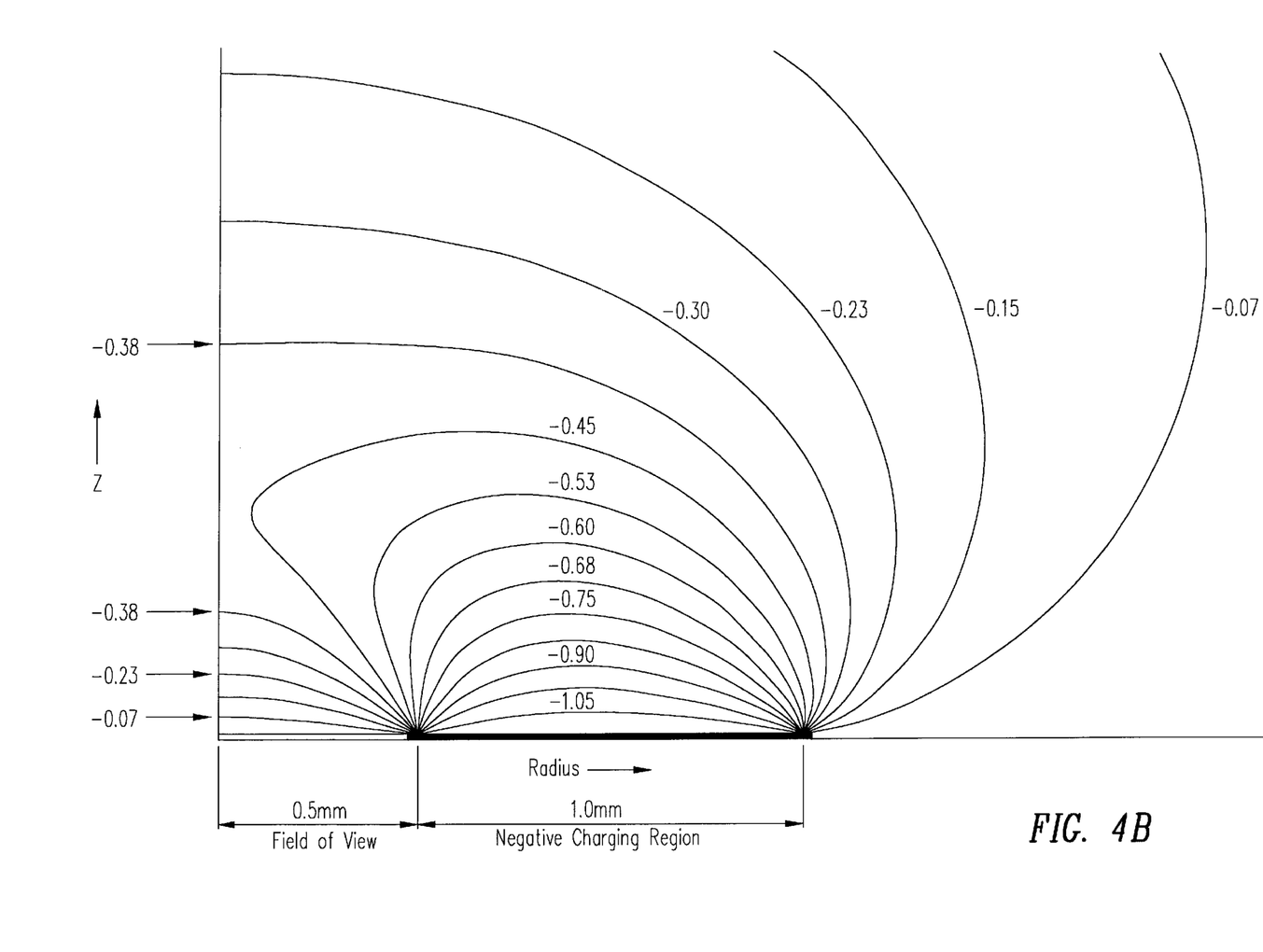

FIGS. 4A and 4B are illustrative computer simulations of a wafer illustrating the influence of surrounding negative charges on the voltage contrast and surface charging within the FOV. The simulations show the equal-potential lines in the r-z plane for the wafer, with r along the radius of the wafer and z along the column axis. The wafer consists of a 0.75 μm thick layer of silicon dioxide on top of grounded silicon. The wafer has a negative surface charge stored in the 1 mm radius surrounding the uncharged FOV area. To simplify the analysis of the sole influence of the surrounding charges, both the wafer chuck and the charge control plate are grounded, and the FOV is assumed to be uncharged. The FOV has a 0.05 mm radius in FIG. 4A and a 0.5 mm radius in FIG. 4B, with surrounding charge densities of $-5 \times 10^{-9}$ $C/cm^2$ and $-4 \times 10^{-9}$ $C/cm^2$, respectively. In both cases, the potential on the surface of the charged area is ~−1 V.

These simulations illustrate that charges outside of the FOV create a MRF directly on top of the FOV. In addition, the MRF is stronger when the FOV is smaller. The 0.05 mm radius FOV (FIG. 4A) results in a −0.71 V MRF, while the 0.5 mm radius FOV (FIG. 4B) results in a −0.38 V MRF due to the development of −1 V at the surrounding area. In reality, the development of a few to 10 V at the surrounding area is often observed. The establishment of a strong MRF retards a large portion of secondary electrons back to image area 96 to charge this area more negatively. This causes the positive contrast to diminish. The MRF can also lead to non-uniform charging, because the retarding strength differs across the FOV, as can be seen in the simulation data. At a high magnification the MRF is strong enough to cause a positive voltage contrast mode to switch to negative. The MRF can also create a complex charging field which manifests into "ghost features."

Figure 5A:
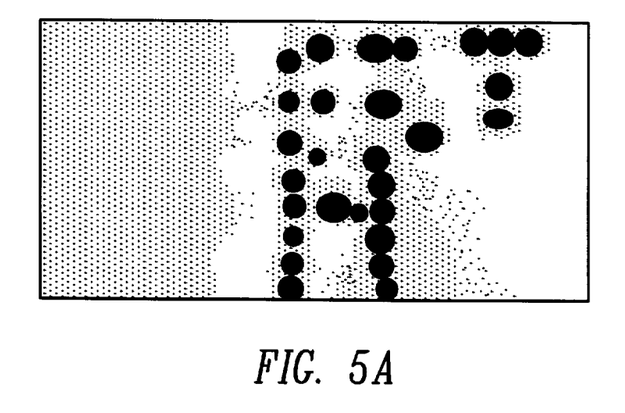
FIGS. 5A–5C are voltage contrast images of a wafer containing filled contacts taken in negative contrast mode, positive contrast mode without multiplexing, and positive contrast mode with mutliplexing, respectively.
Figure 5B:
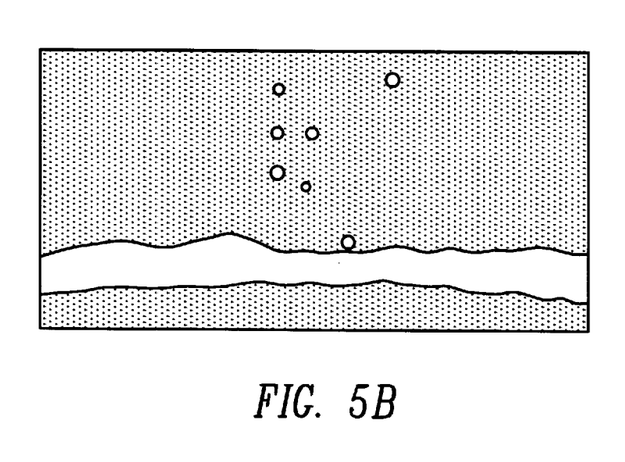

FIGS. 5A and 5B illustrate the unwanted results of the MRF. FIG. 5A is a reference image of a very small part of a semiconductor wafer containing vias that are filled with metal. The image was taken in a negative contrast mode with the charge control plate at ground potential and the wafer chuck at +7 V. FIG. 5B is a positive voltage contrast image of the same wafer, with the charge control plate at ground potential and the wafer chuck at −25 V. Although FIGS. 5A and 5B were taken with different voltage contrast modes, the two figures display a similar voltage contrast, differing only in brightness. The strong MRF and high magnification imaging switched the voltage contrast image of FIG. 5B from positive to negative. In addition, in FIG. 5B the MRF has altered the surface charging such that the contrast is no longer uniform. This is most visible in the background, where an undesirable "ghost feature," which appears as a streak, extends along the lower portion of the image.

Figure 5C:
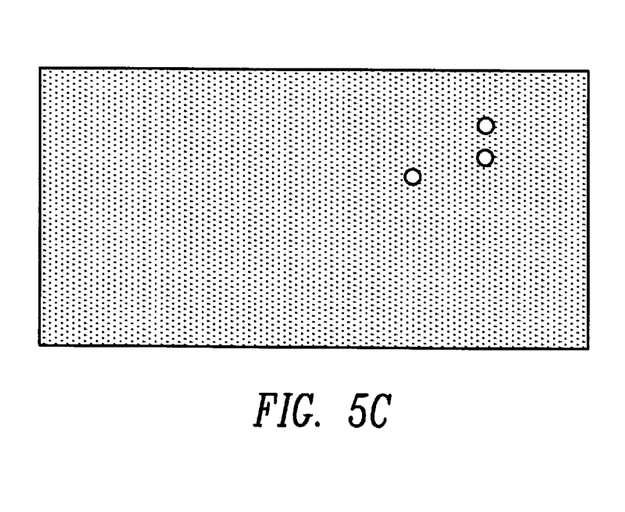
Figure 6:
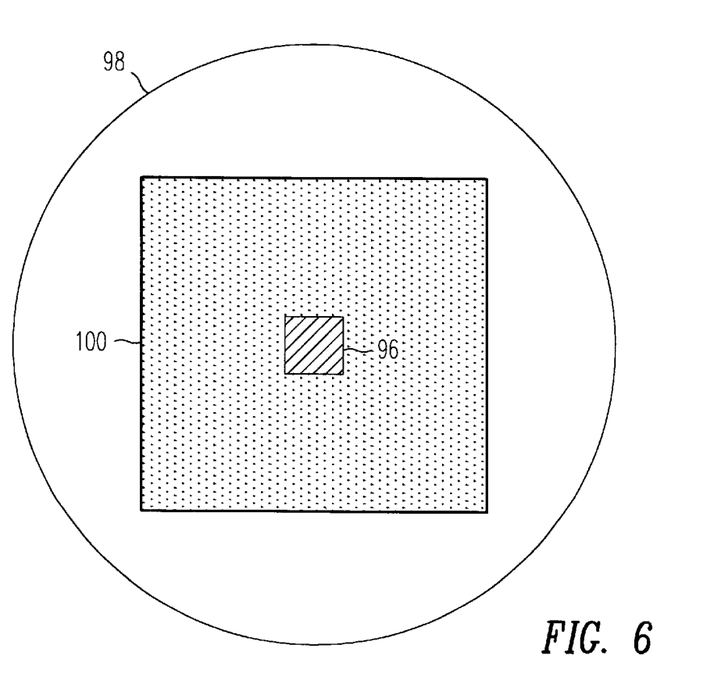
FIG. 6 is a top plan view of the wafer portion of FIG. 3 including a pre-charge erase area.

Charged particle beam inspection tool 10 reduces or eliminates the problems associated with the MRF of FIG. 5B by pre-charging an area 100 (FIG. 6) surrounding image area 96 prior to imaging image area 96. As illustrated in FIG. 6, area 100 is larger than and encompasses image area 96. Pre-charging area 100 removes the negative charges which were deposited during previous image acquisitions, thereby eliminating or reducing the strength of the MRF. FIG. 5C illustrates how pre-charging area 100 prior to imaging image area 96 improves a voltage contrast image. The image of FIG. 5C was acquired using the same positive voltage contrast mode operating conditions as in FIG. 5B and multiplexing between pre-charge area 100 and scan area 96. The image was taken by multiplexing ten pre-charge scans per image scan to remove the influence of returned secondary electrons. Pre-charge area 100 is sixty-four times that of image area 96. The image of FIG. 5C desirably has a uniform, positive contrast without any "ghost features." With a large pre-charge area 100, the MRF becomes negligible and the GCCM effectively provides the negative feedback loop mechanism to bring the surface potential to within a few volts or less of the desired voltage.

Figure 7A:
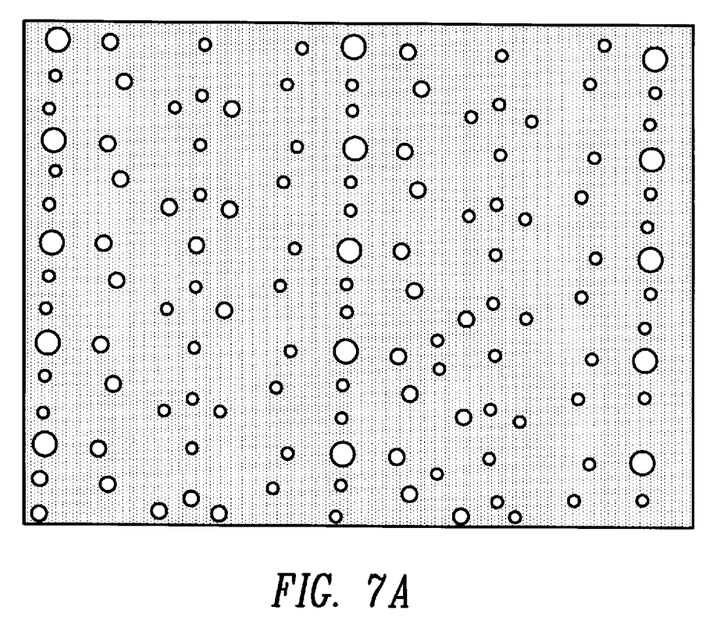
FIGS. 7A and 7B are positive voltage contrast images of a number of SRAM memory cells on a semiconductor wafer taken with and without multiplexing, respectively.
Figure 7B:
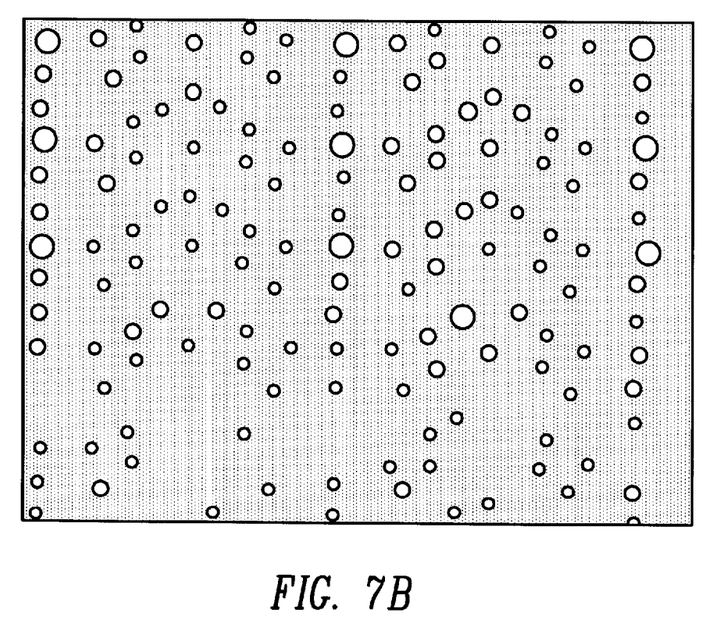

FIGS. 7A and 7B illustrate how multiplexing between pre-charge area 100 and image area 96 improves the voltage contrast quality of an image. FIG. 7A is a positive voltage contrast image of a number of SRAM memory cells on a semiconductor wafer taken with multiplexing between pre-charge area 100 and image area 96. FIG. 7B is a positive voltage contrast image of the same memory cells taken without multiplexing. There is a higher degree of contrast between the lightest areas and the darkest areas in FIG. 7A than in FIG. 7B. In addition, the image of FIG. 7B has a false contrast as several dots in the lower portion of the image have turned black.

These examples illustrate that pre-charging area 100 to reduce or eliminate the MRF is an effective solution for common voltage contrast problems. Multiplexing between pre-charge area 100 and image area 96 can optimize voltage contrast, prevent voltage contrast from degrading over time, prevent voltage contrast mode switching at high magnifications, and eliminate charge-induced "ghost" features and contrast-site dependency.

Area 100 can be pre-charged in a couple of ways. In one embodiment, a flood beam from flood gun 36 pre-charges area 100. Alternatively, the primary beam from the electron gun of electron source 18 pre-charges area 100 in addition to imaging image area 96. Theoretically, it is desired to scan area 100 as large as possible to reduce the negative charging in area 98. However, scanning a larger area 100 will take a longer time, thereby lowering throughput (e.g., the speed at which tool 10 acquires an image of image area 96), because of the lower charge density.

Figure 8:
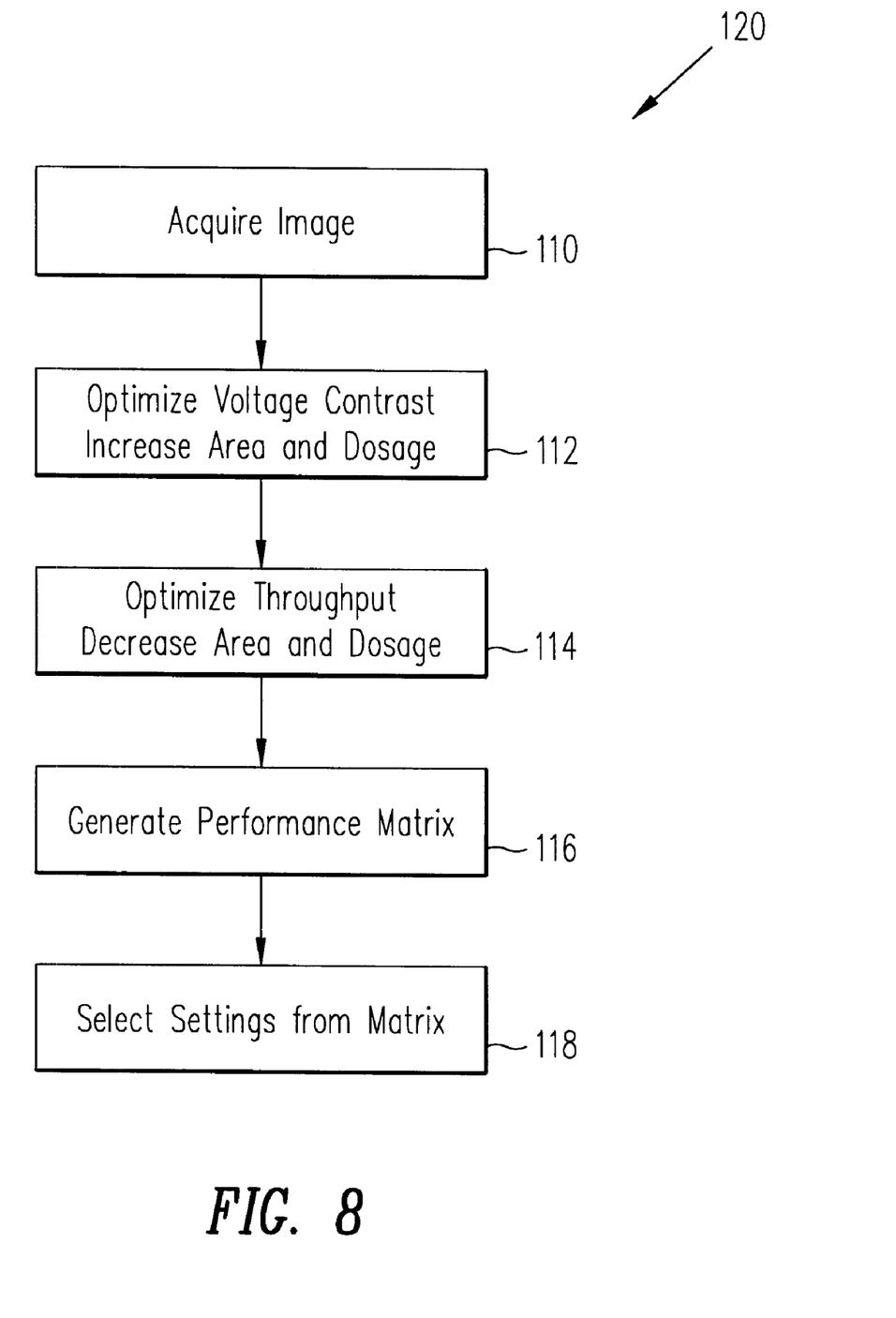
FIG. 8 is a flow diagram for an optimization process for the charged particle beam inspection tool consistent with the present invention.

In accordance with the present invention, optimizing charged particle beam inspection tool 10 includes creating a performance matrix for the tool and selecting those parameters which maximize voltage contrast quality and throughput. By way of example, FIG. 8 illustrates a flow diagram for adjusting scan area 100 and electron dose to optimize the voltage contrast of an image and the tool's throughput (e.g., the speed of image acquisition). It should be noted that the electron dose may also be increased by increasing the beam without impacting throughput. In the first step 110, tool 10 acquires an image of a small region of the patterned substrate or wafer. In step 112, the operator evaluates the voltage contrast by increasing the size of pre-charge area 100 from image area 96 until improvement in the voltage contrast image becomes negligible. At this point the dose density of the beam in pre-charge area 100 is too low to effectively erase the charges in pre-charge area 100. The operator then increases the dose of beam, while maintaining the size of pre-charge area 100 constant, until further improvement in the voltage contrast image becomes negligible. When pre-charge area 100 is large, the operator may choose to select a large spot size to make sure the entire area is irradiated (instead of just narrow scan lines). Increasing the dose of the pre-charge beam includes increasing the beam current and/or the scan time (i.e., the time that the beam is on). In this example, it should be noted that current is assumed to be constant. These first two steps are repeated until the voltage contrast no longer improves, and the maximum pre-charge area size and dose are recorded. The maximum pre-charge area size and dose indicate the upper limits for achieving the best voltage contrast image.

In the next step 114, the operator optimizes throughput of tool 10 at the expense of the voltage contrast. Starting at the maximum pre-charge area size, the operator reduces the pre-charge area size, while maintaining the dose at its maximum, until the voltage contrast quality is unacceptable. The operator records this minimum pre-charge area size. The operator then returns the pre-charge area size to its maximum size, reduces the dose from the maximum dose until the voltage contrast is unacceptable, and records this minimum dose.

Once the maximum and minimum pre-charge area sizes and doses are obtained, the operator generates a performance matrix in step 116. The performance matrix indicates the time required to scan or charge the pre-charge area and the resulting voltage contrast quality, for each pre-charge area size and dose ranging from the minimum to the maximum. An example of a performance matrix is shown in Table 1. Based on the desired voltage contrast quality, the operator in step 118 selects from the performance matrix the appropriate settings. If several settings achieve the desired voltage contrast quality, the operator should preferably choose the setting with the least amount of pre-charge time, in order to optimize throughput. For instance, with the example shown in Table 1, if a good voltage contrast is necessary for a specific inspection, the operator should select the 250×250 $\mu$m pre-charge area with a $2\times10^{-10}$ C dose for the operation.

TABLE 1

| Area/Dose | $1 \times 10^{-10}$ C | $2 \times 10^{-10}$ C | $4 \times 10^{-10}$ C |
|---|---|---|---|
| 100 × 100 $\mu$m | 30 ms/poor | 60 ms/poor | 90 ms/okay |
| 150 × 150 $\mu$m | 30 ms/poor | 60 ms/poor | 90 ms/okay |
| 200 × 200 $\mu$m | 30 ms/poor | 60 ms/okay | 90 ms/good |
| 250 × 250 $\mu$m | 30 ms/okay | 60 ms/good | 90 ms/good |

In generating the performance matrix, numerous other "influential" parameters affecting surface charging should be considered in conjunction with adjusting scan areas 96 and 100. These parameters include beam energy, beam current, spot size (e.g., by de-focusing the beam), scan direction relative to the circuit pattern, and charge control module (e.g., wafer chuck bias voltage, charge control plate bias voltage, and energy filter voltage). Because there are so many parameters, it is impossible to adjust all of them simultaneously. The following is a procedure which simplifies the adjustment of these parameters. First, the operator acquires images without area scan 100, zooming out far enough to avoid or delay the development of the MRF (as can be detected from the poor contrast quality) but not too far that evaluating the contrast between circuits of different underlying connections becomes difficult. The operator varies one of the above-mentioned parameters at a time, examines the contrast and selects the value which provides good contrast between the different circuits. The operator repeats this process for each of the parameters. The resulting set of values is used as a base line. The operator also ranks the parameters in terms of their influence on the voltage contrast.

Next, the operator optimizes the voltage contrast quality by integrating the performance matrix procedures, such as that shown in Table 1, into the "influential" parameter (e.g., beam energy, beam current, etc.) tuning procedures. The operator generates a performance matrix starting from the base line parameters. If none of the contrast qualities in the matrix is satisfactory, the operator should choose the performance matrix parameters that produce the best results. The operator then tunes the parameter that was previously identified as the most influential in the "influential" list. After setting this parameter to the value which gives the best result, the operator will need to repeat these procedures for the next most influential parameter from the list. The operator may need to iterate these procedures for several parameters before the most satisfactory parameters are found.

Figure 9:
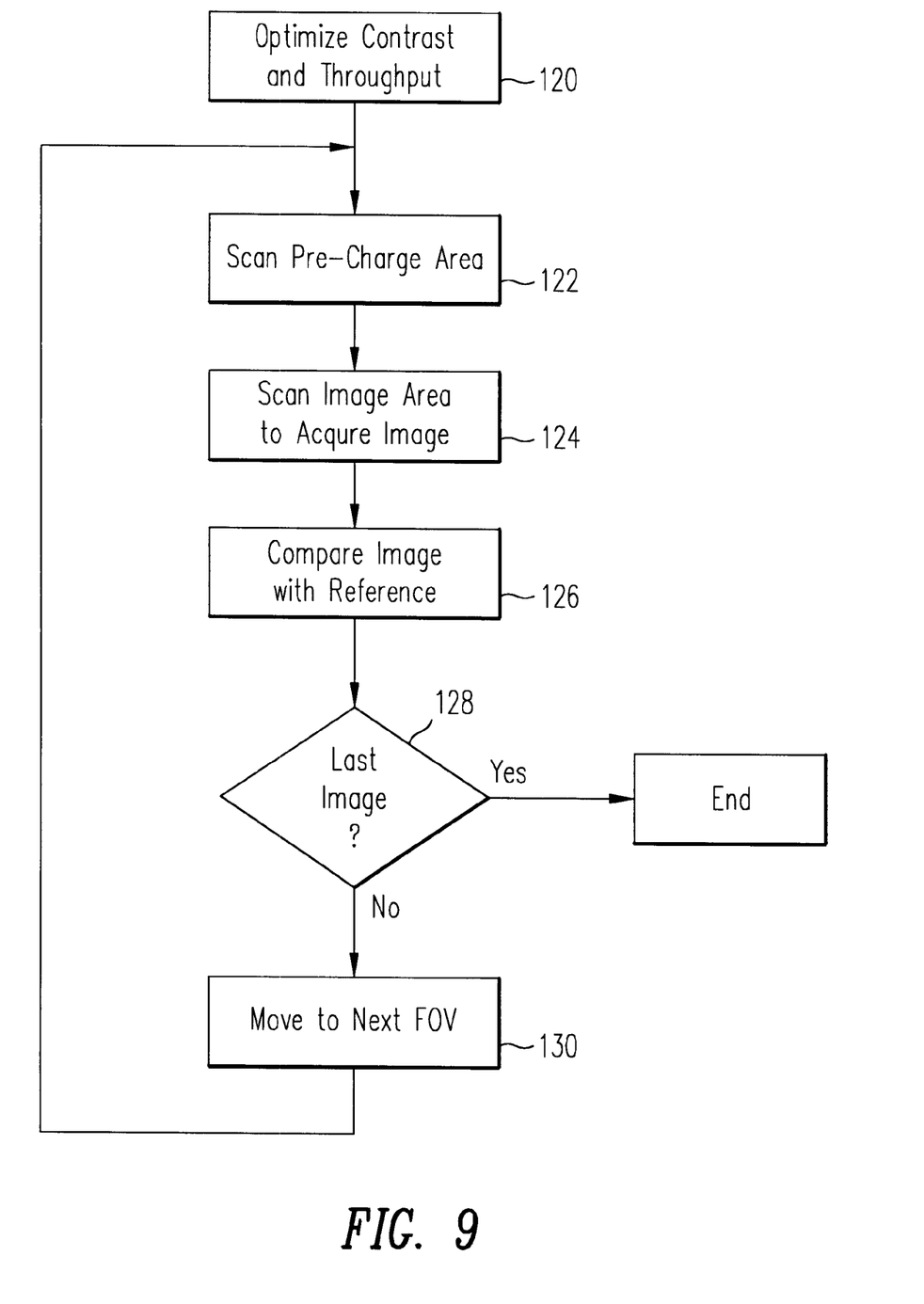
FIG. 9 is a flow diagram for a defect detection process consistent with the present invention.

FIG. 9 is a flow diagram of the process which charged particle beam inspection tool 10 uses to detect defects in a patterned substrate or wafer. As discussed above, the first step 120 is to optimize the image quality and throughput of tool 10. At step 122, tool 10 scans pre-charge area 100 of the patterned substrate with either the flood beam or the primary beam from electron source 18. When tool 10 scans pre-charge area 100, a set of X-Y scanners or beam deflectors (not shown) in column 12 operate at a high amplitude to cover the larger area of pre-charge area 100. At step 124, tool 10 scans image area 96 of the patterned substrate with the primary beam to acquire an image of image area 96. As discussed above, the primary beam operates at a low voltage, typically between 500 eV to 1.5 keV, to prevent damage to wafer 22. The set of X-Y scanners operate at a lower amplitude when the primary beam scans image area 96 in order to obtain a high resolution image of the patterned substrate. In a preferred embodiment, the flood beam has a beam current at least four times that of the primary imaging beam and scans a pre-charge area 100 at least twice image area 96. At step 126 the acquired image is compared with a reference in order to identify any defects in the patterned substrate. The reference to which the acquired image is compared may be another portion of the same patterned substrate, a different patterned substrate, or an image stored in a database. At step 128, tool 10 inquires as to whether it has acquired the last image. If tool 10 has not acquired the last image, then tool 10 in step 130 moves to the next FOV and repeats steps 122–128 are repeated until the entire inspection process is complete. Tool 10 moves to the next FOV by stage movement or by image scan shifting of the large FOV lens.

Although it is desirable to always pre-charge the surrounding area prior to acquiring an image, it may not be necessary to pre-charge the area when acquiring the first image at a new location on the device or wafer, as the general potential distribution at the new location and its surrounding area may not have been significantly altered. The decision as to whether to pre-charge the surrounding area prior to acquiring the first image at a new location should be factored into the optimization process.

To reduce statistical noise in the voltage contrast image, it is often necessary to acquire multiple frame scans of the same area and to average these images together. Each frame scan, however, alters the surface potential of the scanned area and accumulates uncaptured secondary electrons on the surrounding area, thereby forming the MRF which quickly alters the potential of the image area 96, especially in the high magnification inspection mode. With the change in the surface potential of image area 96 and the MRF, averaging the image frame data will become inadequate and eventually nullify the benefit of pre-charging area 100.

Figure 10:
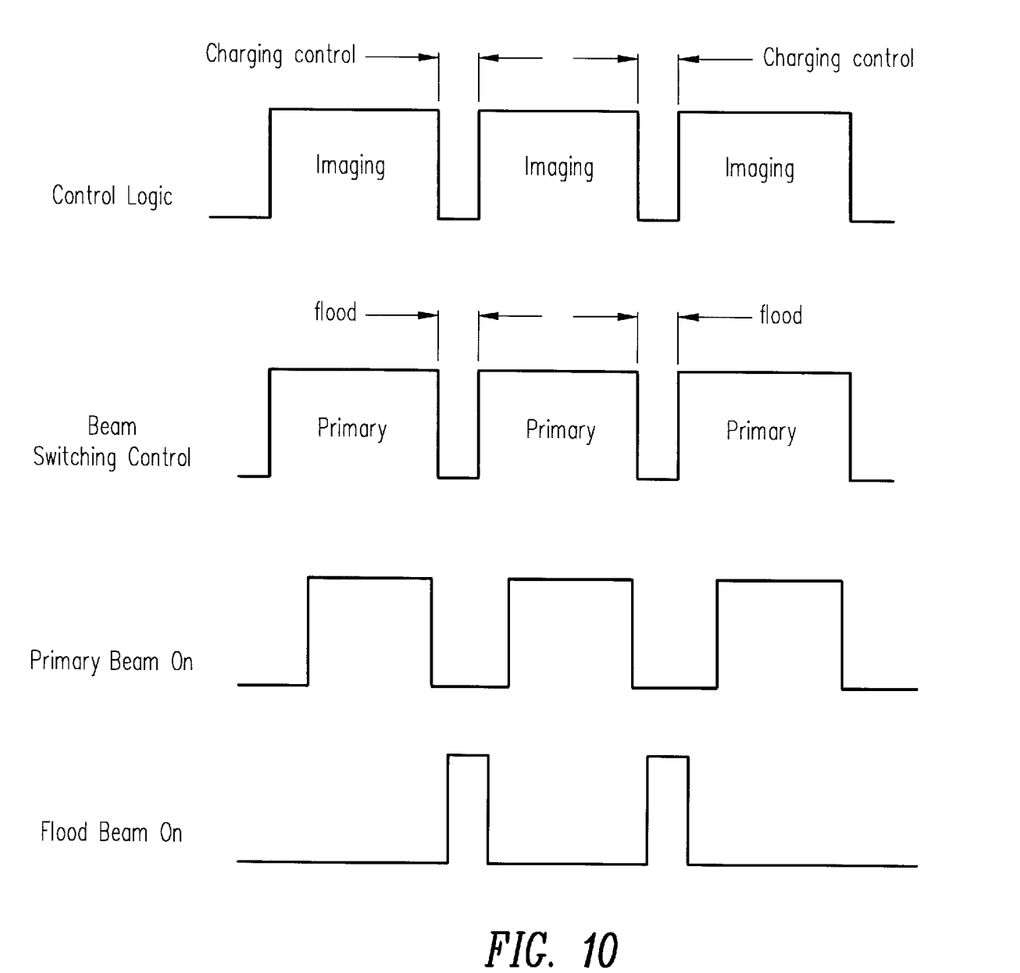
FIG. 10 is a diagram of the control waveforms of the charged particle beam inspection tool, illustrating the multiplexing between a primary imaging beam and a flood beam.

A solution to the continuous change of the surface potential is to pre-charge area 100 in between successive images of image area 96. One embodiment is illustrated in FIGS. 9 and 10. Tool 10 can multiplex between scanning pre-charge area 100 and image area 96, steps 122 and 124, respectively, to generate multiple images of image area 96. FIG. 10 illustrates control waveforms showing how tool 10 multiplexes between the broad, high current flood beam and the high-resolution primary imaging beam to produce multiple images of image area 96 (the horizontal axis is time). When the flood beam is activated, the primary beam is blanked off temporarily, and the flood beam is deflected onto the patterned substrate. The X-Y scanner switches between high and low amplitudes depending on whether the flood beam or primary imaging beam is activated (not shown). It should be noted that step 122 need not be inserted before each step 124 but can be inserted after multiple imaging frames (step 124) before going on to another multiple imaging frames. A rolling average of these acquired images can then be compared with a reference in order to identify defects in the patterned substrate. In the alternative, the multiple images can be averaged with simple arithmetic. The resulting image is highly uniform with enhanced contrast, because the tool has been optimized to eliminate or reduce the effects of the MRF and other asymmetrical charging on the patterned substrate.

While the present invention has been described with reference to a few specific embodiments, the description is illustrative of the invention and is not to be construed as limiting the invention. For example, although the present invention has been described with respect to voltage contrast imaging, it may also be used to improve images produced by conventional SEMs or other charged particle microscopes. In addition, it is not necessary to use a scanned flood beam to pre-charge. Instead, the flood gun can be used with a broad, unscanned beam to perform the pre-charge operation. Various modifications may occur to those skilled in the art without departing from the true spirit and scope of the invention as defined by the appended claims. The method described above provides a more uniform imaging environment and facilitates defect detection.

What is claimed is:

1. A method of detecting defects in a patterned substrate comprising the acts of:
   directing a charged particle beam onto the substrate;
   scanning the beam across the substrate;
   optimizing parameters of the beam to improve uniformity and contrast of a resulting image and an image acquisition speed;
   acquiring an image of a first area of the substrate from charged particles from the substrate, including charging a second area of the substrate and imaging the first area, the second area encompassing the first area; and
   comparing the acquired image with a reference to identify defects in the patterned substrate.

2. The method of claim 1, wherein optimizing the parameters includes optimizing at least one of a scan area size, scan speed, beam dose, beam current, beam energy, beam spot size, wafer chuck bias voltage, charge control plate bias voltage, energy filter voltage, and scan direction relative to a circuit pattern, and wherein the parameters being optimized for the first and second areas need not be the same.

3. The method of claim 1, wherein optimizing the parameters improves a voltage contrast of the image such that a background of the image has the same degree of contrast throughout the image.

4. The method of claim 1, wherein optimizing the parameters improves a voltage contrast of the image such that a circuit on the substrate has the same degree of contrast as other circuits with the same underlying connections.

5. The method of claim 1, wherein optimizing the parameters improves a voltage contrast of the image such that a circuit on the substrate has the same voltage contrast consistency when located anywhere within the first area.

6. The method of claim 1, wherein optimizing the parameters improves a voltage contrast of the image such there is a greater variation between the lightest and darkest areas of the image.

7. The method of claim 1, wherein the reference is any one of a stored image in a database, another patterned substrate, and a different portion of the same patterned substrate.

8. The method of claim 1, wherein the beam is produced from an electron-beam source.

9. The method of claim 8, further comprising the acts of emitting a focused beam from a primary electron gun for imaging the first area and emitting a flood beam from a flood gun for charging the second area.

10. The method of claim 9, further comprising the acts of scanning at a high amplitude when the flood beam is on and scanning at a lower amplitude when the focused beam is on.

11. The method of claim 1, further comprising the acts of:
    alternating between charging the second area and imaging the first area to acquire a plurality of images of the first area; and
    averaging the plurality of images.

12. The method of claim 11, wherein averaging the plurality of images includes generating a rolling average of the plurality of images.

13. The method of claim 11, wherein averaging the plurality of images includes simple arithmetic averaging.

14. A method of detecting defects in a patterned substrate comprising the acts of:
    directing a charged particle beam onto the substrate;
    scanning the beam across the substrate;
    optimizing parameters of the beam to improve uniformity and voltage contrast of a resulting image and an image acquisition speed, wherein optimizing the parameters includes:
       creating a performance matrix including second area sizes and beam doses ranging from a low second area size and a low beam does, respectively, at which the image acquisition speed is optimized, to a high second area size and a high beam dose, respectively, at which the best voltage contrast image is produced, the performance matrix indicating a voltage contrast quality and a time required to perform a charge operation at each respective second area size and beam does; and
       selecting from the performance a particular second area size and beam dose based on a desired voltage contrast quality, such that there is a greater variation between the lightest and darkest areas of the image;
    acquiring an image of a first area of the substrate from charged particles from the substrate, including charging a second area of the substrate and imaging the first area, the second area encompassing the first area; and
    comparing the acquired image with a reference to identify defects in the patterned substrate.

15. A method of detecting defects in a patterned substrate comprising the acts of:
    directing a charged particle beam onto the substrate;
    scanning the beam across the substrate;
    optimizing parameters of the beam to improve uniformity and voltage contrast of a resulting image and an image acquisition speed, wherein optimizing the parameters includes:
       creating a performance matrix with at least one of a scan area size, scan speed, beam does, beam current, beam energy, beam spot size, wafer chuck bias voltage, charge control plate bias voltage, energy filter voltage, and scan direction relative to a circuit pattern, the performance matrix indicating a voltage contrast quality and a time required to perform a charge operation at each setting; and selecting from the performance matrix a particular setting based on a desired voltage contrast quality, such that there is a greater variation between the lightest and darkest areas of the image;

acquiring an image of a first area of the substrate from charged particles fiom the substrate, including charging a second area of the substrate and imaging the first area, the second area encompassing the first area; and comparing the acquired image with a reference to identify defects in the patterned substrate.

16. A method of detecting defects in a patterned substrate comprising the acts of:

directing a charged particle beam onto the substrate;

scanning the beam across the substrate;

optimizing parameters of the beam to improve uniformity and contrast of a resulting image and an image acquisition speed;

acquiring an image of a first area of the substrate from charged particles form the substrate, including removing a negative charge from a second area of the substrate and imaging the first area, the second area encompassing the first area; and comparing the acquired image with a reference to identify defects in the patterned substrate.

17. The method of claim 16, wherein removing the negative charge from the second area of the substrate avoids a voltage contrast switch from positive to negative in the first area with increased magnification.

18. The method of claim 16, wherein removing the negative charge from the second area of the substrate avoids an appearance of charging-induced "ghost features" on the acquired image.

* * * * *